(12) United States Patent
Stasiak et al.

(10) Patent No.: US 7,255,805 B2
(45) Date of Patent: Aug. 14, 2007

(54) PHOTONIC STRUCTURES, DEVICES, AND METHODS

(75) Inventors: James Stasiak, Lebonon, OR (US); David Champion, Lebonon, OR (US); Kevin Peters, Corvallis, OR (US); Donald J. Coulman, Corvallis, OR (US); Tony S. Cruz-Uribe, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 350 days.

(21) Appl. No.: 10/755,955

(22) Filed: Jan. 12, 2004

(65) Prior Publication Data
US 2005/0150864 A1    Jul. 14, 2005

(51) Int. Cl.
*G02B 6/136* (2006.01)

(52) U.S. Cl. .............................. 216/24; 216/52; 216/57

(58) Field of Classification Search ....................... None
See application file for complete search history.

(56) References Cited

U.S. PATENT DOCUMENTS

| | | | |
|---|---|---|---|
| 5,172,267 A | 12/1992 | Yablonovitch | |
| 5,335,240 A | 8/1994 | Ho et al. | |
| 5,406,573 A | 4/1995 | Ozbay et al. | |
| 5,440,421 A | 8/1995 | Fan et al. | |
| 5,600,483 A | 2/1997 | Fan et al. | |
| 5,651,818 A | 7/1997 | Milstein et al. | |
| 5,772,905 A | 6/1998 | Chou | |
| 5,997,795 A | 12/1999 | Danforth et al. | |
| 5,998,298 A | 12/1999 | Fleming et al. | |
| 6,139,626 A | 10/2000 | Norris et al. | |
| 6,309,580 B1 | 10/2001 | Chou | |
| 6,358,653 B1 | 3/2002 | Turberfield et al. | |
| 6,358,854 B1 | 3/2002 | Fleming et al. | |
| 6,392,787 B1 | 5/2002 | Cirelli et al. | |
| 6,468,823 B1 | 10/2002 | Scherer et al. | |
| 6,469,682 B1 | 10/2002 | de Maagt et al. | |
| 6,482,742 B1 | 11/2002 | Chou | |
| 6,517,995 B1 | 2/2003 | Jacobson et al. | |
| 6,518,189 B1 | 2/2003 | Chou | |
| 2002/0045136 A1 | 4/2002 | Fritze et al. | |
| 2002/0062782 A1 | 5/2002 | Norris et al. | |
| 2002/0079497 A1* | 6/2002 | Gopinath | 257/79 |

(Continued)

FOREIGN PATENT DOCUMENTS

EP    1072954 A2    1/2001

(Continued)

OTHER PUBLICATIONS

Johnson, "Nanolith effort harnesses . . ." EETimes Aug. 5, 2003 http://www.eetimes.com/story/OEG2003080550035.

(Continued)

*Primary Examiner*—Allan Olsen

(57) ABSTRACT

Photonic crystal structures are made by a method including steps of providing a substrate, depositing at least one planar layer to form a stack, each planar layer of the stack comprising two or more sublayers having different sublayer refractive indices, depositing a hard mask material, depositing an imprintable material over the hard mask material, patterning the imprintable material by imprinting an array of depressions, and directionally etching at the depressions a regular array of openings through the hard mask material and the stack.

32 Claims, 5 Drawing Sheets

U.S. PATENT DOCUMENTS

| | | |
|---|---|---|
| 2002/0115002 A1 | 8/2002 | Bailey et al. |
| 2002/0154403 A1 | 10/2002 | Trotter, Jr. |
| 2002/0159126 A1* | 10/2002 | Sigalas et al. .............. 359/245 |
| 2002/0167118 A1 | 11/2002 | Billiet et al. |
| 2003/0141507 A1 | 7/2003 | Krames et al. |
| 2004/0214427 A1* | 10/2004 | Kloster et al. .............. 438/637 |

FOREIGN PATENT DOCUMENTS

| | | |
|---|---|---|
| JP | 2000-258650 A | 9/2000 |
| JP | 2000-284136 A | 10/2000 |
| JP | 2000-314817 A | 11/2000 |
| JP | 2002-323631 A | 11/2002 |
| JP | 2002-323632 A | 11/2002 |

OTHER PUBLICATIONS

Anon. "UV based Nanoimprint Lithography" http://www.amo.de/amica/nanoimprint.html (date unknown).

Sreenivasan "Nanoimprint Lithography . . . " http://www.nnf.cornell.edu/JapanUS/SreenivasanJUSSSymposium.

Lammers, "Nanoimprint lithography ready . . . " Dec. 2, 2002 http://www.eetimes.com/at/news/OEG20021220S0022.

Hewitt, "Moulds cut photonic crystal costs" May 16, 2002 http://nanotechweb.org/articles/news/1/5/8/1.

Fleming et al. "All-metallic three-dimensional photonic . . . " Nature, V. 417 (May 2, 2002), pp. 52-55.

Service "Building Better Photonic Crystals" Science, V. 295 (Mar. 29, 2002) p. 2399.

Frenkel "Playing Tricks with Designer 'Atoms'" Science, V. 296 (Apr. 5, 2002) pp. 65-66.

Anon. "Si-based photonic . . . " http//fisicavolta.unipv.it/dipartimento/ricerca/fotonici/Cofin . . . pdf.

Vlasov et al. "On-chip natural assembly of silicon photonic . . . " Nature V.414 (Nov. 15, 2001) pp. 289-293.

Lin et al."Silicon Three-dimensional Photonic . . . " Sandia National Lab report SAND2002-3612 (Nov. 2001).

Gasser et al. "Real-Space Imaging . . . " Science V. 292 (Apr. 13, 2001) pp. 258-262.

Norris et al. "Chemical Approaches to Three-Dimen . . . " Adv. Meter., V. 13(6) Mar. 16, 2001 pp. 371-376.

Parker et al. "Photonic Crystals" Aug. 2000 http://physicsweb.org/article/world/13/8/9/1.

Wang et al. "Direct nanoimprint of submicron . . . " Appl. Phys. Let. V. 75(18) (Nov. 1, 1999) pp. 2767-2769.

Vlasov et al. "Synthesis of Photonic Crystals for Optical . . . " Adv. Mater. V. 11(2) (1999) pp. 165-169.

Cheng et al. "Controlled growth of hard-sphere colloidal . . . " Nature, V. 401 (Oct. 28, 1999) pp. 893-895.

Jiang et al. "Single Crystal Colloidal Multilayers . . . " Chem. Mater., V. 11 (Jul. 15, 1999), pp. 2132-2140.

Van Blaaderen et al. "Template-directed colloidal crystalliz . . . " Nature V. 385 (Jan. 23, 1997) pp. 321-324.

Astratov et al. "Photonic band gaps in 3D ordered . . . " Phys. Let. A, V. 222 (Nov. 11, 1996) pp. 349-353.

Chou et al. "Imprint Lithography with 25-Nanometer . . . " Science V. 272 (5258) (Apr. 5, 1996) pp. 85-87.

Chou et al. "Imprint of sub-25 nm vias . . . " Appl. Phys. Let. V. 67(21) (Nov. 20, 1995) pp. 3114-3116.

McGurn et al. "Photonic band structures of two- . . . " Phys. Rev. B V. 48(23) Dec. 15, 1993, pp. 17576-17579.

Yablonovitch et al. "Photonic Band Structure . . . " Phys. Rev. Let. V. 67(17) Oct. 21, 1991 pp. 2295-2298.

Ho et al. "Existence of a Photonic Gap . . . " Phys. Rev. Let. V. 65(25) (Dec. 17, 1990) pp. 3152-3155.

Kuramochi, Eiichi et al. "Drilled alternating-layer structure for three-dimensional photonic crystals with a full band gap"; Journal of Vacuum Science & Technology: Nov. 2000.

International Search Report for Patent Application No. PCT/US2004/041861, filed Dec. 14, 2004. Search completed on May 31, 2005.

* cited by examiner

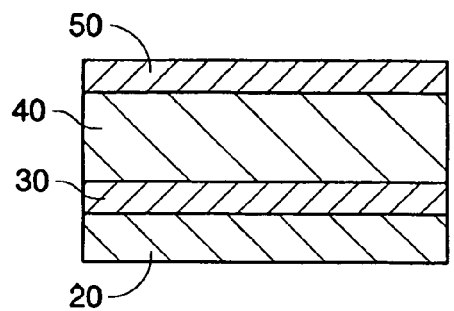
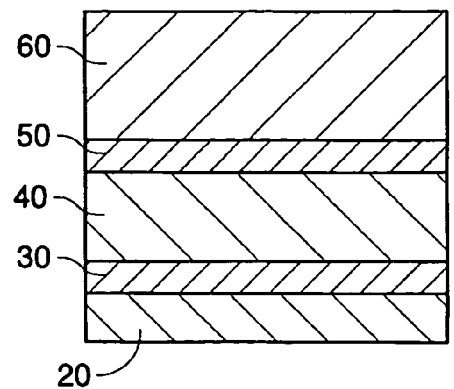
Fig. 2A                Fig. 2B
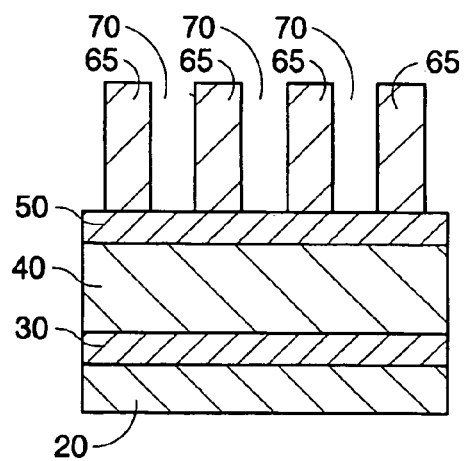
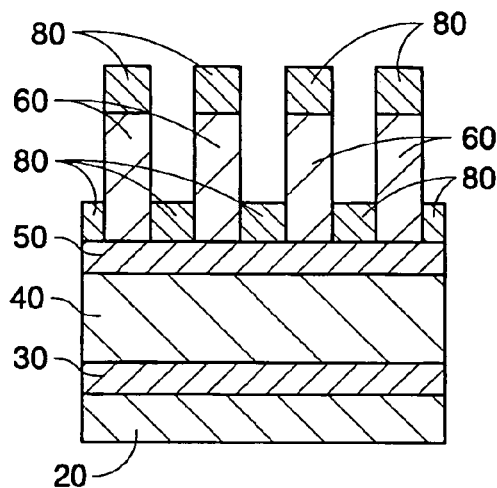
Fig. 2C                Fig. 2D
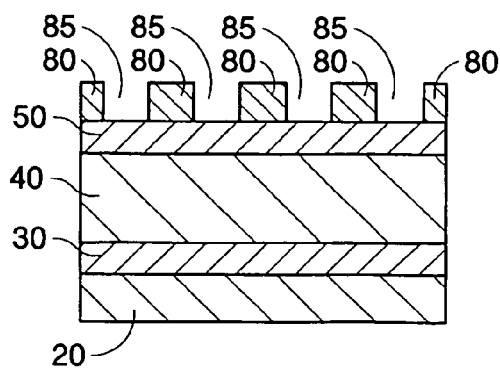
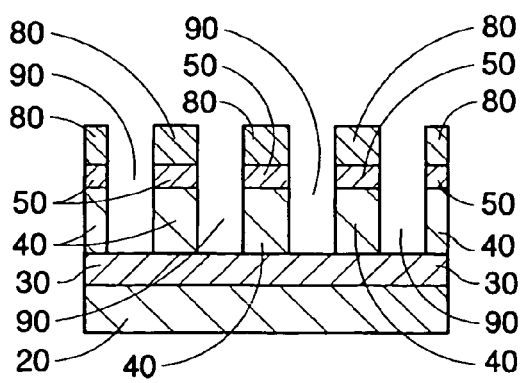
Fig. 2E                Fig. 2F

PHOTONIC STRUCTURES, DEVICES, AND METHODS

CROSS-REFERENCE TO RELATED APPLICATION

This application is related to co-pending and commonly assigned application Ser. No. 10/737,460 filed Dec. 16, 2003, the entire disclosure of which is incorporated herein by reference.

TECHNICAL FIELD

This invention relates to photonic structures such as photonic crystals and more particularly to methods for making such photonic structures.

BACKGROUND

Photonic crystals are spatially periodic structures having useful electromagnetic wave properties, such as photonic bandgaps. In principle, the spatial periodicity of a photonic crystal can be in one, two, or three dimensions. There is especially high interest in developing technology of artificial photonic crystals that are useful in new and improved functional photonic devices, especially for the infrared and visible-light portions of the electromagnetic spectrum. Functional devices using photonic crystals, such as selective reflectors, filters, optical couplers, resonant cavities, delay lines, and waveguides have been proposed and/or fabricated.

Several methods for forming artificial photonic crystals are known. Multilayered dielectric films have been used to make one-dimensional photonic crystals along the dimension perpendicular to the films.

Three-dimensional photonic crystals have been formed by stacking and bonding wafers in which periodic structures have been micro-machined by etching. Such methods result in structures called "wood-pile" or "picket-fence" structures because the stacked elements have an appearance similar to stacked square timbers. Such methods require precise alignment of the micro-machined wafers to be bonded together, which becomes more difficult as the number of layers increases and as the dimensions of micro-machined features are reduced.

Some of the known methods for forming artificial photonic crystals work by modifying the refractive index periodically in a material originally having a uniform refractive index. For example, light-wave interference or holography has been used to create periodic variations of refractive index within photosensitive materials, such as photoresist, to make photonic crystals. Perhaps the simplest methods for forming a one- or two-dimensional photonic crystal are those methods that form a periodic or quasi-periodic array of holes in a uniform slab of material. A vacuum or material filling the holes has a different index of refraction from the base material of the slab. In the background art, such holes have been formed by micro-machining or by nanoscale lithography, such as electron-beam or ion-beam lithography. Conversely, such charged-particle beam lithography has also been used to selectively assist deposition of material to form spaced elements of the photonic crystal.

Some photonic crystals have been formed by self-assembly of very small particles provided in a colloidal suspension. A colloidal suspension is used (e.g., in a Langmuir-Blodgett type of process) to form a periodic array of nano-particles (e.g., nano-spheres). This structure can then be backfilled using atomic-layer chemical vapor deposition (ALCVD), for example. The colloidal structure can be removed, thus forming an inverse opal structure.

Another approach has been to use substantially smaller nano particles along with the larger nanospheres in a suspension. As the material is dried in a sedimentation process, pressed and then sintered, a periodic structure is formed. The nanospheres can be removed, resulting in an inverse opal structure. Thus, when the colloidal particles themselves have been removed to leave an "inverse" photonic crystal, the crystal lattice positions are occupied by voids in a matrix.

In another example of a colloidal process, nanocrystals have been assembled from a colloidal suspension, concentrated as close-packed clusters in pores in a template (the pores being larger than the nanocrystals) to form a quantum-dot solid. In some cases, the interstitial spaces between the colloidal particles have been filled with a second material of a different refractive index.

While all of these methods and others have been used successfully to make small quantities of photonic crystals, more efficient and lower-cost methods for mass-production fabrication of photonic crystals are needed.

BRIEF DESCRIPTION OF THE DRAWINGS

The features and advantages of the disclosure will readily be appreciated by persons skilled in the art from the following detailed description when read in conjunction with the drawings, wherein:

FIGS. 2A-2J show a series of cross-sectional side elevations of structural embodiments at various stages of fabrication using a second embodiment of a method performed in accordance with the invention.

DETAILED DESCRIPTION OF EMBODIMENTS

Figure 1:
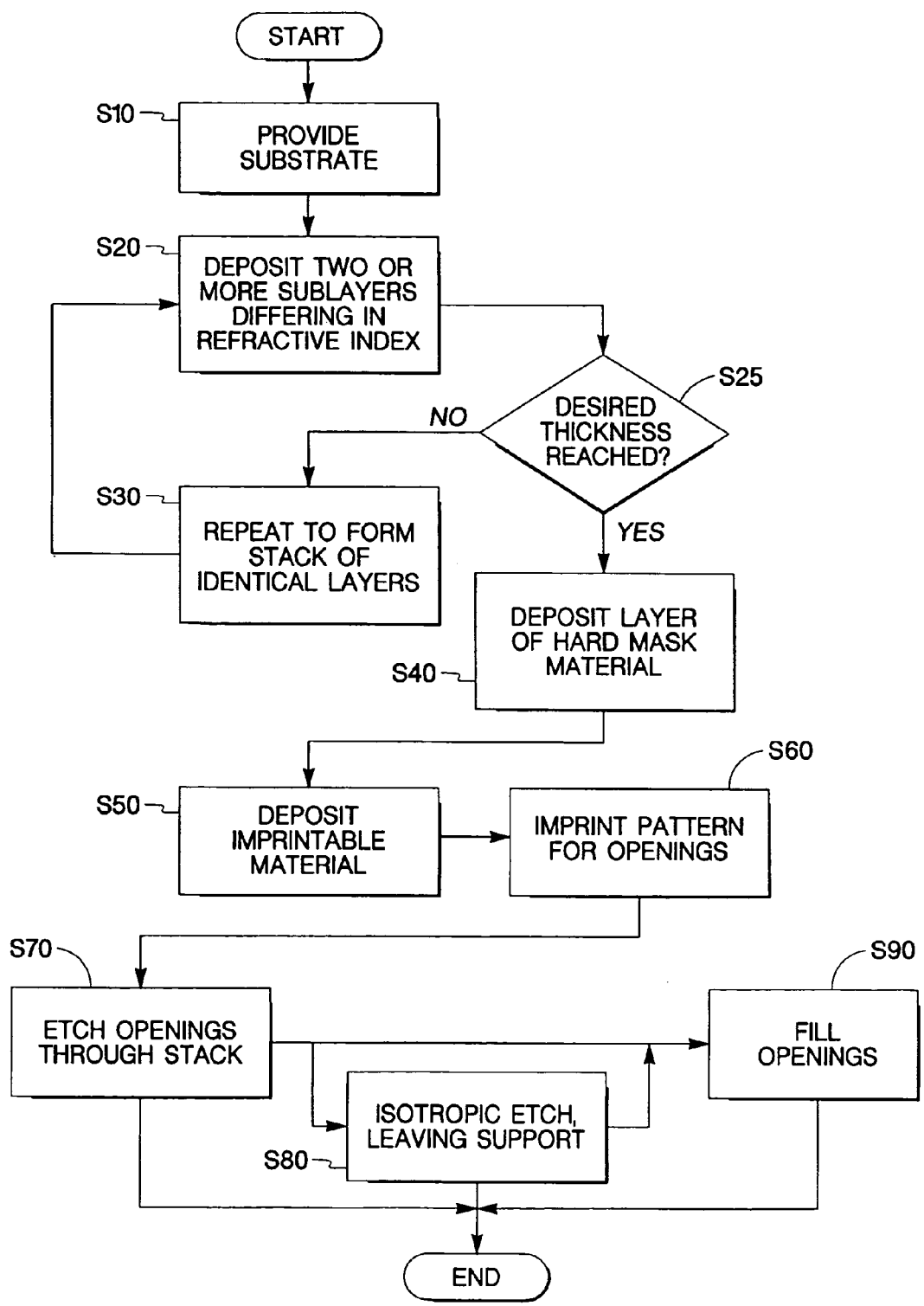
FIG. 1 is a flow chart illustrating a first embodiment of a method performed in accordance with the invention.

Throughout this description and the appended claims, the prefix "nano-" is used to refer to dimensions expressed in nanometers, i.e., dimensions less than about one micrometer. Nano-imprint lithography methods as used in the embodiments described herein are known to be capable of forming structures having minimum dimensions of less than about 25 nanometers as well as structures having larger dimensions. See, e.g., S. Y. Chou et al., "Imprint Lithography with 25-Nanometer Resolution," Science, Vol. 272, pp. 85-87 (Apr. 5, 1996) and U.S. Pat. No. 5,772,905 to S. Y. Chou, entitled "Nanoimprint Technology," issued on Jun. 30, 1998. The entire disclosure of each of these is incorporated herein by reference.

The drawings are not drawn to any uniform scale. In particular, vertical and horizontal scales may differ and may vary from one drawing to another. Method steps shown in the drawings are designated by reference numerals S10, . . . , . . . , S90.

One aspect of the invention is an embodiment of a method (shown in FIG. 1) for making a photonic structure, including the steps of providing a substrate (S10) and depositing (step S20) a planar layer comprising two or more sublayers having different sublayer refractive indices. If the desired thickness has not been reached (decision step S25), step S20 may be repeated a number of times to accumulate a number of planar layers to form a stack of planar layers (step S30). The planar layers of the stack may be substantially identical. The stack of planar layers may be characterized in part by the layer pitch, i.e., the distance from a point in one layer to the corresponding point in the next layer. Thus, the pitch is generally equal to the thickness of the planar layers.

A hard mask material is deposited (step S40) on the top surface of the stack, and an imprintable material is deposited over the hard mask material (step S50). The imprintable material is patterned (step S60) by imprinting an array of depressions. In step S70, a regular array of openings is directionally etched at the depressions, through the hard mask material and the stack, the openings extending through the stack thickness. If there are no intervening layers, the openings may extend to the substrate. An embodiment of a photonic crystal may be made by this method and/or by the variations described below, and an integrated-circuit embodiment may be made comprising the photonic crystal.

The substrate for many embodiments has a planar top surface comprising a substance such as silicon, silicon oxide, silicon nitride, germanium, glass, aluminum oxide, diamond, metal, metal oxide, metal nitride, and combinations of these materials. Zirconia ($ZrO_2$) is an example of a metal oxide that may be used. The planar layers of the stack include sublayers, which may also comprise these substances and/or their combinations. The embodiment examples described below may include alternate sublayers of polysilicon and a metal such as tungsten, or alternate layers of polyimide or other low-stress film and tungsten, for example. In another embodiment, the sublayers may consist of alternating sublayers of epitaxial silicon grown under differing epitaxy conditions to vary the refractive index systematically between alternate sublayers. For example, four to eight layers, each comprising two sublayers may form the stack. For such embodiments, the substrate may have a specific suitable crystallographic orientation, such as a (100) plane of silicon.

The hard mask material may be a thin layer of silicon dioxide, silicon nitride, or silicon oxynitride, for example. The imprintable material may comprise a polymer such as an ultraviolet (UV)-curable polymer, a thermoplastic polymer, a thermosetting polymer, a polyester, a polycarbonate, a photoresist, or polymethylmethacrylate (PMMA).

The step S70 of directionally etching openings through the hard mask and the stack may be performed by reactive ion etching (RIE). Specific reactive ion etching methods are known to those skilled in the art for many materials, including all the materials given as examples herein.

FIG. 1 also illustrates a variation of the method embodiment described above, in which a portion of a selected material is isotropically etched from the sublayers of the stack in step S80, while leaving a portion of the selected material un-etched for supporting the stack. Step S80 of isotropically etching a portion of the selected material may be performed by wet chemical etching, for example.

In step S90, the openings may be filled with a substance having a refractive index differing from the refractive index of at least one of the sublayers of the stack.

Those skilled in the art will recognize that the method, e.g., from step S20 to steps S70, S80, and/or S90, may be repeated a number of times to produce a photonic structure having any desired thickness, each repetition using the previous stack as a substrate.

The openings formed through the stack may be arranged in a substantially regular array, such as a rectangular array with the openings aligned in rows parallel to two orthogonal axes. The rows of openings may be spaced apart along at least one of the two orthogonal axes by a distance substantially equal to the layer pitch of the stack. Thus, the resulting photonic structure may have orthorhombic symmetry. In particular, the openings may be arranged in a square array, aligned and equally spaced in rows parallel to two orthogonal axes. Thus, the resulting photonic structure may have cubic symmetry. Other arrangements of the openings may result in hexagonal symmetry or other symmetries known in the art of crystallography.

Each sublayer has a sublayer thickness, resulting in the layer pitch described above, and the regular array of openings is characterized by at least one opening pitch. The sublayer thickness (resulting in the layer pitch) and the pitch of the openings cooperate such that the resultant photonic structure has desired optical properties, such as a desired photonic bandgap.

FIGS. 2A-2J show a series of cross-sectional side elevation views of structures at various stages of fabrication of an embodiment of a photonic crystal, made by a method embodiment that differs in details from the embodiment illustrated by FIG. 1. The initial substrate 20 may be a silicon wafer. Other embodiments may use other substrate materials such as glasses or plastics. Suitable low-temperature deposition processes and dry etching processes may be used with substrates that are not suitable for high temperatures and/or wet etching processes.

As shown in FIG. 2A, a silicon nitride layer 30 is deposited on the substrate, and a layer of polysilicon 40 is deposited over the silicon nitride layer 30. Materials other than polysilicon, which have various dielectric constants or refractive indices, may be incorporated instead of, or in addition to, polysilicon. An additional layer 50 of silicon nitride may be deposited over polysilicon layer 40 to provide a chemical mechanical polishing (CMP) stop.

Figure 2G:
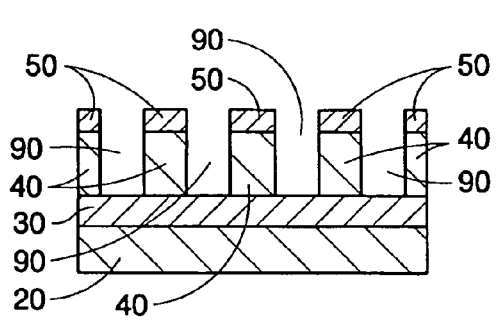

As shown in FIG. 2B, a layer of resist 60 (such as PMMA or other nano-imprint-lithography resist or a "step-and-flash" resist) is applied. As shown in FIG. 2C, a desired photonic crystal pattern is pressed into the resist 60, using nano-imprint lithography, stamping, or "step-and-flash" imprinting methods. After imprinting, RIE etching is used to remove resist residue, leaving patterned resist 65 with openings 70. As shown in FIG. 2D, a hard mask material 80 is deposited over the imprinted surface, i.e., over both the patterned resist 65 and openings 70. As shown in FIG. 2E, the resist is removed while leaving hard mask features 80 in place. FIG. 2F shows the result of etching the silicon nitride layer 50 and polysilicon layer 40 through the openings in hard mask 80, down to silicon nitride etch-stop layer 30, forming openings 90. As shown, hard mask 80 may also be removed by an etching process. FIG. 2G shows the photonic-crystal pattern with openings 90 separating features comprising polysilicon elements 40. As mentioned above, other materials may be substituted for polysilicon or may be used with polysilicon. In some embodiments, the photonic-crystal structure shown in FIG. 2G may be used as shown without further processing.

Figure 2H:
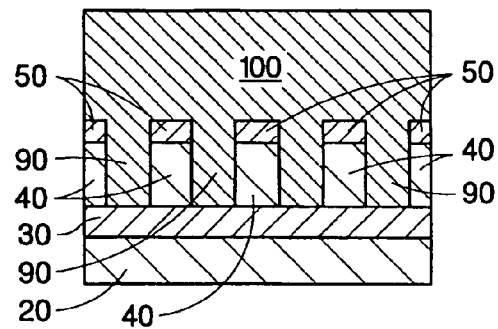
Figure 2I:
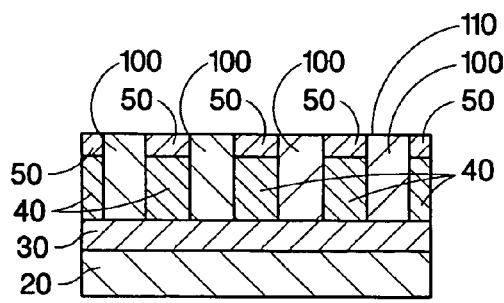

In other embodiments, as shown in FIG. 2H, a dielectric material 100 such as silicon dioxide is deposited, at least filling openings 90. The resulting surface is planarized, forming a planar top surface 110 at the top of silicon nitride layer 50, which acts as a stop (FIG. 2I). Silicon nitride layer 50 may be removed, providing a one-dimensional photonic-crystal structure 10. As shown in the one-dimensional photonic-crystal structure 10 of FIG. 2J, the silicon dioxide material 100 has been removed. Optionally, for some embodiments, the silicon dioxide material 100 may be left in place. Depending on the materials used, such a one-dimensional photonic-crystal structure (formed by using imprinted features) can be used for optical filters, waveguides, optical sensors, etc.

Figure 2J:
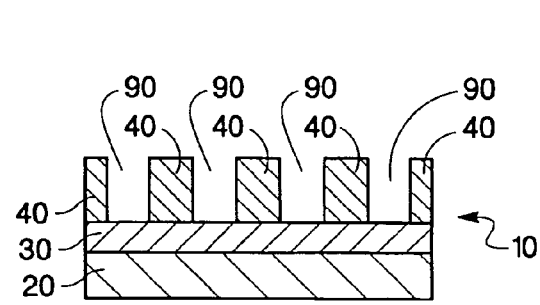
Figure 3:
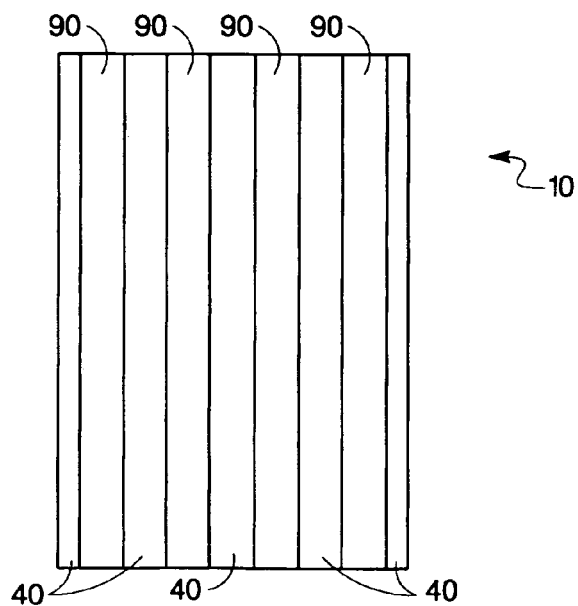
FIG. 3 is a top plan view of an embodiment of a photonic crystal made in accordance with the invention, corresponding to FIG. 2J.

FIG. 3 shows a top view of the photonic-crystal structure 10 that is shown in cross-section in FIG. 2J.

If the application requires higher-dimensional photonic-crystal structures, the imprinting process outlined above can be repeated, producing complex two-and three-dimensional structures. Examples of two and three dimensional photonic crystals are illustrated in FIGS. 4, 5, and 6.

Figure 4:
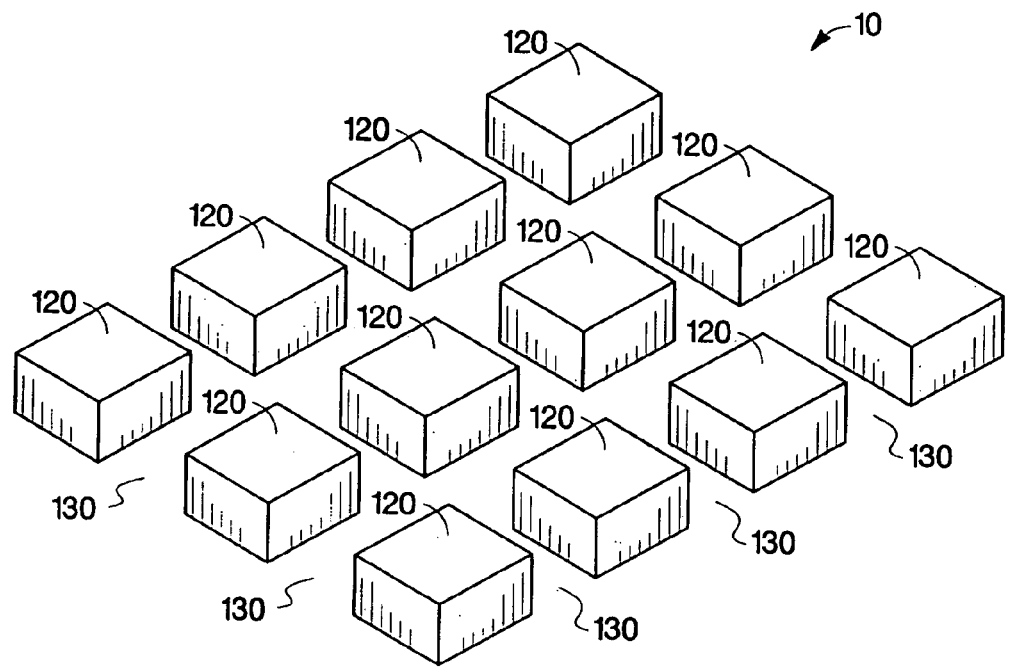
FIG. 4 is a perspective view of a first structural embodiment made in accordance with the invention.

FIG. 4 shows a simple two-dimensional photonic-crystal structure 10 in which the gaps 130 between the imprinted features 120 can contain vacuum, air, other gases, or other materials that have dielectric constants or refractive indices differing from those of the imprinted features.

Figure 5:
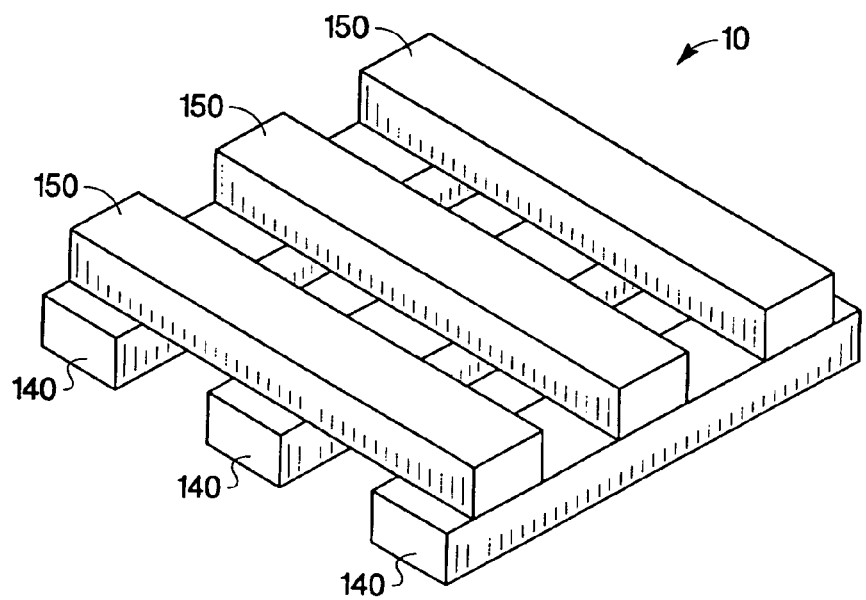
FIG. 5 is a perspective view of a second structural embodiment made in accordance with the invention.

FIG. 5 shows a "wood-pile" photonic-crystal structure 10 known in the art of photonic emitters. When made by methods of the present invention, elements 140 in a first crystallographic layer are formed in a first lithographic process, and elements 150 in a second crystallographic layer are formed in a similar second lithographic process, each layer requiring only one nano-imprint lithography step. The pattern made in the nano-imprint lithography of the second layer is oriented at an angle (e.g., about 90 degrees in FIG. 5) to the pattern made in the nano-imprint lithography of the first layer. While FIG. 5 shows only two layers, those skilled in the art will readily recognize that any number of such layers may be made, each suitably stacked over another.

Figure 6:
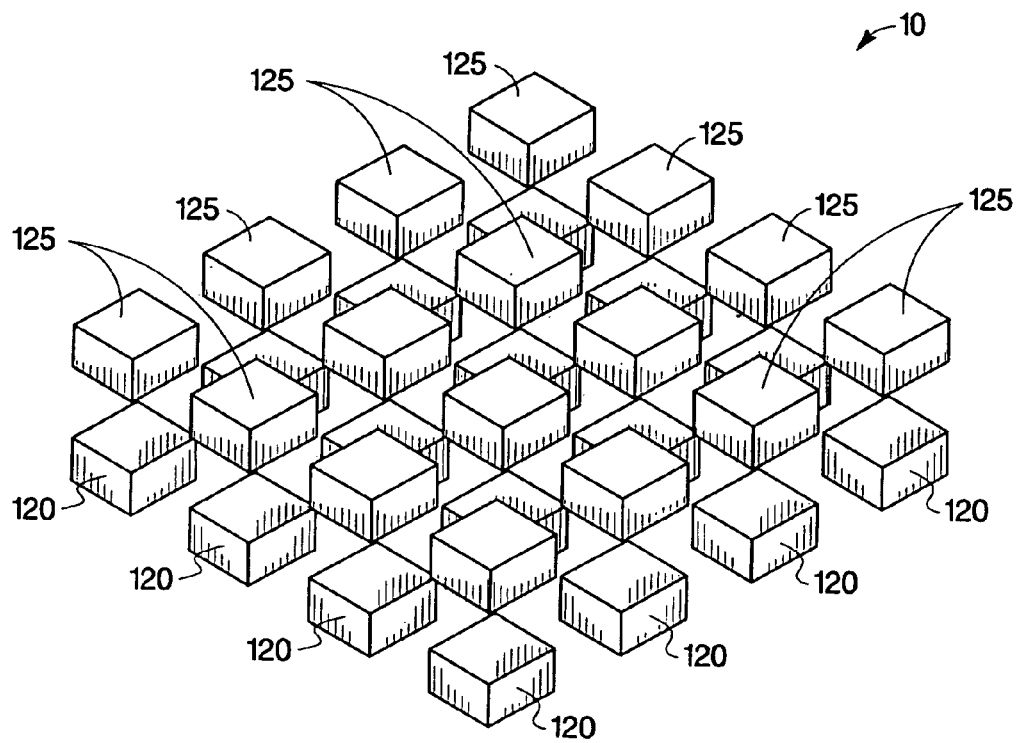
FIG. 6 is a perspective view of a third structural embodiment made in accordance with the invention.

FIG. 6 shows a more complex three-dimensional photonic-crystal structure 10 in which the periodicity of alternating layers may be varied layer to layer as desired. Thus, the periodicity of elements 120 in the lower layer shown in FIG. 6 may be made to differ from the periodicity of elements 125 in the upper layer. Again, while FIG. 6 shows only two layers, those skilled in the art will readily recognize that any number of such layers may be made, each suitably stacked over another, with a desired variation in periodicity. The periodicity of each layer in a stack may be made to differ from the periodicity of its adjacent layers. Thus, the periodicity or lattice parameter may be varied from one layer to another in any desired manner, e.g., continuously, discontinuously, monotonically increasing or decreasing, periodically, etc., for various purposes.

Figure 7:
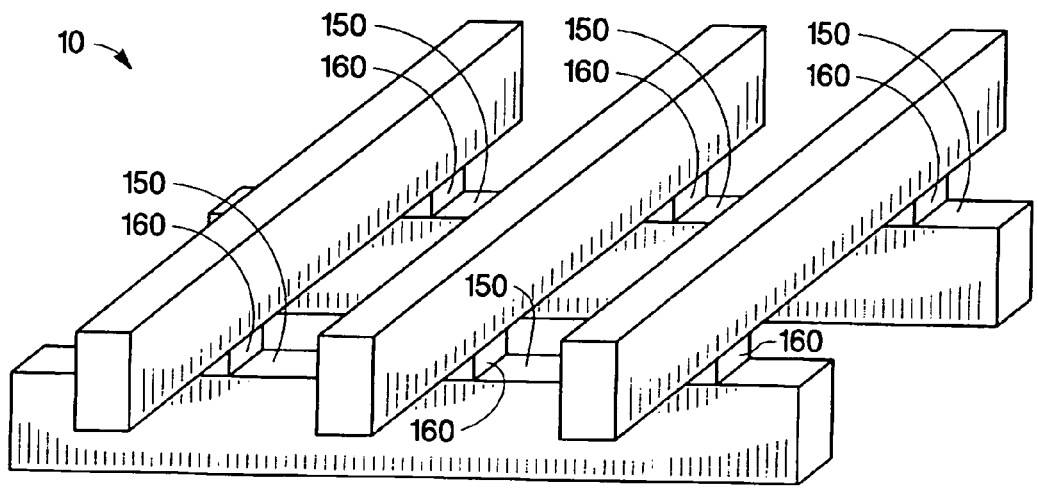
FIG. 7 is a perspective view of a fourth structural embodiment made in accordance with the invention.

FIG. 7 shows a structural variation achievable using methods of the present invention. As described above with reference to process step S80 (FIG. 1), an etch process may be used to remove material from regions 150, leaving support posts 160.

Thus, a wide variety of crystal structures and feature dimensions may be patterned and fabricated using the methods of the invention. Various crystallographic structures may be created, such as simple cubic, closed-packed cubic, wurtzite, zinc blende (sphalerite), diamond, and hybrid mixtures of crystallographic structures having various symmetries.

INDUSTRIAL APPLICABILITY

Methods of the present invention and the photonic crystals made by these methods are useful for manipulating and controlling propagation of electromagnetic waves. The structures may be used in optical integrated circuits, photonic circuits incorporating such integrated circuits, and many other applications. The methods are suitable for mass-production fabrication of photonic crystals, at relatively low cost, due to the simplicity of the fabrication method and the need for only one nano-imprint lithography step for a one- or two-dimensional crystal, for some three-dimensional crystals, or for each layer of a multi-dimensional crystal.

Although the foregoing has been a description and illustration of specific embodiments of the invention, various modifications and changes thereto can be made by persons skilled in the art without departing from the scope and spirit of the invention as defined by the following claims. For example, the order of steps may be varied for some applications. Various functionally equivalent materials may be substituted for materials used as examples in this description. Also, for example, successive repetitions of the fabrication method to produce a photonic structure of arbitrarily large thickness may use uniform layer thicknesses or may vary the layer thicknesses in any desired manner, e.g., to form a superlattice in the vertical direction.

What is claimed is:

1. A method for making a photonic structure, the method comprising the steps of:
   a) providing a substrate;
   b) depositing at least one planar layer to form a stack having a top surface and a stack thickness, each planar layer of the stack comprising two or more sublayers having different sublayer refractive indices;
   c) depositing a hard mask material upon the top surface of the stack;
   d) depositing an imprintable material over the hard mask material;
   e) patterning the imprintable material by imprinting a regular array of depressions;
   f) directionally etching at the depressions a regular array of openings through the hard mask material and the stack;
   g) isotropically etching a portion of a selected material from the sublayers of the stack, while leaving a portion of the selected material un-etched to support the stack; and
   h) repeating a subset of steps b) through f) until a desired total thickness is reached.

2. A method for making a photonic structure, the method comprising the steps of:
   a) providing a substrate;
   b) depositing at least one planar layer to form a stack having a top surface and a stack thickness, each planar layer of the stack comprising two or more sublayers having different sublayer refractive indices;
   c) depositing a hard mask material upon the top surface of the stack;
   d) depositing an imprintable material over the hard mask material;
   e) patterning the imprintable material by imprinting an array of depressions;
   f) directionally etching at the depressions a regular array of openings through the hard mask material and the stack; and
   g) filling the openings with a substance having a refractive index differing from the refractive index of at least one of the sublayers of the stack; and
   h) repeating a subset of steps b) through f) until a desired total thickness is reached.

3. A method for making a photonic structure, the method comprising the steps of:
a) providing a substrate;
b) depositing at least one planar layer to form a stack having a top surface and a stack thickness, each planar layer of the stack comprising two or more sublayers having different sublayer refractive indices;
c) depositing a hard mask material upon the top surface of the stack;
d) depositing an imprintable material over the hard mask material;
e) patterning the imprintable material by imprinting an array of depressions;
f) directionally etching at the depressions a regular array of openings through the hard mask material and the stack;
g) isotropically etching a portion of a selected material from the sublayers of the stack, while leaving a portion of the selected material un-etched to support the stack; and
h) filling the openings with a substance having a refractive index differing from the refractive index of at least one of the sublayers of the stack; and
i) repeating a subset of steps b) through step f) until a desired total thickness is reached.

4. A method for making a photonic structure, the method comprising the steps of:
a) providing a substrate;
b) depositing at least one planar layer to form a stack having a top surface and a stack thickness, each planar layer of the stack comprising two or more sublayers having different sublayer refractive indices;
c) depositing a hard mask material upon the top surface of the stack;
d) depositing an imprintable material over the hard mask material;
e) patterning the imprintable material by imprinting an array of depressions;
f) directionally etching at the depressions a regular array of openings through the hard mask material and the stack; and
g) repeating a subset of steps b) through f) until a desired total thickness is reached.

5. The method of claim 4, wherein the openings extend to the substrate.

6. The method of claim 4, wherein each sublayer has a sublayer thickness and the regular array of openings is characterized by at least one opening pitch, and wherein the sublayer thickness and the at least one opening pitch cooperate such that the resultant photonic structure has a desired photonic bandgap.

7. The method of claim 4, wherein the planar layers of the stack include at least one sublayer comprising a substance selected from the list consisting of silicon, silicon oxide, silicon nitride, germanium, glass, aluminum oxide, diamond, metal, metal oxide, metal nitride, and combinations thereof.

8. The method of claim 4, wherein the planar layers of the stack include at least one sublayer comprising polysilicon.

9. The method of claim 4, wherein the planar layers of the stack include at least one sublayer comprising tungsten.

10. The method of claim 4, wherein the hard mask material comprises a thin layer of a substance selected from the list consisting of silicon dioxide, silicon nitride, and silicon oxynitride.

11. The method of claim 4, wherein the step of directionally etching openings through the hard mask material and the stack is performed by reactive ion etching (RIE).

12. The method of claim 4, wherein the photonic structure has orthorhombic symmetry.

13. The method of claim 4, wherein the photonic structure has cubic symmetry.

14. The method of claim 4, wherein the stack comprises a plurality of planar layers.

15. The method of claim 14, wherein the stack comprises a plurality of substantially identical planar layers.

16. The method of claim 4, wherein the substrate has a planar top surface.

17. The method of claim 16, wherein at least the planar top surface of the substrate comprises a substance selected from the list consisting of silicon, silicon oxide, silicon nitride, germanium, glass, aluminum oxide, diamond, metal, and combinations thereof.

18. The method of claim 16, wherein the planar top surface of the substrate comprises a (100) crystallographic plane of silicon.

19. The method of claim 4, wherein the planar layers of the stack include sublayers comprising alternating sublayers of epitaxial silicon grown under differing epitaxy conditions, whereby refractive index varies systematically between alternate sublayers.

20. The method of claim 19, wherein the substrate comprises a (100) crystallographic plane of silicon.

21. The method of claim 4, wherein the imprintable material comprises a polymer.

22. The method of claim 12, wherein the imprintable material comprises a substance selected from the list consisting of an ultraviolet (UV)-curable polymer, a thermoplastic polymer, a thermosetting polymer, a polyester, a polycarbonate, a photoresist, or polymethylmethacrylate (PMMA).

23. The method of claim 4, wherein patterning step e) and etching step f) are performed to form a predetermined periodicity of the openings in each layer.

24. The method of claim 23, wherein the predetermined periodicity of the openings differs between adjacent layers, whereby the lattice parameter varies between adjacent layers of the photonic structure.

25. The method of claim 4, further comprising the step of:
h) filling the openings with a substance having a refractive index that differs from the refractive index of at least one of the sublayers of the stack.

26. The method of claim 25, wherein the step h) of filling the openings is performed by filling the openings with silicon dioxide.

27. The method of claim 4, further comprising the step of:
i) isotropically etching a portion of a selected material from the sublayers of the stack, while leaving a portion of the selected material un-etched to support the stack.

28. The method of claim 27, wherein the step i) of isotropically etching a portion of a selected material is performed by wet chemical etching.

29. The method of claim 4, wherein the openings are arranged in a rectangular array, wherein the array has a first set of parallel rows of openings that are orthogonally aligned to a second set of parallel rows of openings.

30. The method of claim 29, wherein the stack of planar layers is characterized by a layer pitch, and the rows of openings are spaced apart along at least one of the two orthogonal axes by a distance substantially equal to the layer pitch of the stack.

31. The method of claim 4, wherein the openings are arranged in a square array, wherein the array has a first set of parallel rows of equally spaced openings that are orthogonally aliased to a second set of parallel rows of equally spaced openings.

32. The method of claim 31, wherein the stack of planar layers is characterized by a layer pitch, and the rows of openings are spaced apart along each of the two orthogonal axes by a distance substantially equal to the layer pitch of the stack.

* * * * *

UNITED STATES PATENT AND TRADEMARK OFFICE
CERTIFICATE OF CORRECTION

PATENT NO. : 7,255,805 B2
APPLICATION NO. : 10/755955
DATED : August 14, 2007
INVENTOR(S) : James Stasiak et al.

It is certified that error appears in the above-identified patent and that said Letters Patent is hereby corrected as shown below:

In column 8, line 33, in Claim 22, after "claim" delete "12" and insert -- 21 --, therefor.

In column 9, line 7, in Claim 31, delete "aliased" and insert -- aligned --, therefor.

Signed and Sealed this

Eleventh Day of November, 2008

JON W. DUDAS
*Director of the United States Patent and Trademark Office*